United States Patent
Pan (10) Patent No.: US 7,860,467 B2
(45) Date of Patent: Dec. 28, 2010

(54) POWER CONTROL FOR A DUAL MODE TRANSMITTER

(75) Inventor: Meng-An Pan, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 555 days.

(21) Appl. No.: 11/511,645

(22) Filed: Aug. 29, 2006

(65) Prior Publication Data

US 2008/0057883 A1 Mar. 6, 2008

(51) Int. Cl.
H04B 1/04 (2006.01)

(52) U.S. Cl. .................... 455/127.1; 330/285

(58) Field of Classification Search .............. 455/550.1, 455/552.1, 553.1, 115.1, 126, 127.1–127.4; 330/281, 282, 285, 297
See application file for complete search history.

(56) References Cited

U.S. PATENT DOCUMENTS

| | | | |
|---|---|---|---|
| 5,193,219 A | 3/1993 | Tamura |
| 5,661,434 A | 8/1997 | Brozovich et al. |
| 5,715,521 A | 2/1998 | Fukasawa et al. |
| 5,732,334 A | 3/1998 | Miyake |
| 6,020,787 A | 2/2000 | Kim et al. |
| 6,252,463 B1 | 6/2001 | Kobayashi |
| 6,255,906 B1 | 7/2001 | Eidson et al. |
| 6,265,935 B1 | 7/2001 | Kaneda et al. |
| 6,366,172 B1 | 4/2002 | Hayashi et al. |
| 6,369,649 B2 | 4/2002 | Nakajima |
| 6,580,901 B1 | 6/2003 | Mochizuki |
| 6,700,440 B2 | 3/2004 | Hareyama |
| 6,757,526 B1 | 6/2004 | Sharp et al. |
| 6,784,837 B2 | 8/2004 | Revankar et al. |
| 6,888,411 B2 | 5/2005 | Behzad et al. |
| 6,968,201 B1 | 11/2005 | Gandhi et al. |
| 6,996,382 B2 | 2/2006 | Higuchi |
| 7,023,275 B2 | 4/2006 | Miyamoto |
| 7,027,783 B2 | 4/2006 | Vilhonen et al. |

(Continued)

FOREIGN PATENT DOCUMENTS

DE 102004039830 A1 3/2006

(Continued)

OTHER PUBLICATIONS

Office Action received for U.S. Appl. No. 11/495,675, mailed on Apr. 13, 2009, 13 pages.

(Continued)

*Primary Examiner*—Thanh C Le
(74) *Attorney, Agent, or Firm*—Brake Hughes Bellermann LLP (57) ABSTRACT

A circuit may be provided. The circuit may be a component of a dual mode transmitter such as a transmitter from the 802.11x family. The circuit may comprise an amplifier configured to provide amplification of a signal for transmission in either a first transmission mode or a second transmission mode, using power supplied from a power supply, the amplifier including at least one cascode transistor in series with at least one amplifying transistor. The circuit may further comprise a power controller configured to define an operating characteristic of the at least one cascode transistor, and thereby designate an amount of the power from the power supply that is used by the amplifier during the amplification, based on whether the amplifier is to be operated in the first transmission mode or the second transmission mode.

20 Claims, 9 Drawing Sheets

U.S. PATENT DOCUMENTS

| | | | |
|---|---|---|---|
| 7,203,511 | B2 | 4/2007 | Trachewsky et al. |
| 7,242,251 | B2 | 7/2007 | Boos |
| 7,304,679 | B1 | 12/2007 | Johnson et al. |
| 7,365,599 | B2 | 4/2008 | Filimonov et al. |
| 7,459,969 | B2 | 12/2008 | Pan |
| 7,477,102 | B1 | 1/2009 | Ellis et al. |
| 7,539,468 | B2 | 5/2009 | Tsuda |
| 2002/0008576 | A1 | 1/2002 | Nakajima |
| 2002/0118065 | A1 | 8/2002 | Miyamoto |
| 2002/0136325 | A1 | 9/2002 | Pehlke et al. |
| 2002/0146993 | A1* | 10/2002 | Persico et al. ............. 455/126 |
| 2003/0152163 | A1 | 8/2003 | Khorram |
| 2004/0108901 | A1* | 6/2004 | Apel et al. ................. 330/285 |
| 2004/0176052 | A1 | 9/2004 | Vilhonen et al. |
| 2004/0219898 | A1 | 11/2004 | Bult et al. |
| 2005/0164667 | A1 | 7/2005 | Pan et al. |
| 2006/0049875 | A1 | 9/2006 | Boos |
| 2007/0270111 | A1* | 11/2007 | Pan ........................ 455/127.1 |

FOREIGN PATENT DOCUMENTS

| | | | |
|---|---|---|---|
| EP | 0718969 | A2 | 6/1996 |
| EP | 0977354 | A1 | 2/2000 |
| EP | 1467481 | A1 | 10/2004 |
| EP | 1484840 | A2 | 12/2004 |

OTHER PUBLICATIONS

Search Report received for EP Application No. 06027031.1-1233, mailed on Sep. 19, 2007, 3 pages.
Response to Office Action received for U.S. Appl. No. 11/495,675, filed on Aug. 12, 2009, 15 pages.
Office Action received for U.S. Appl. No. 10/761,625, mailed on May 5, 2006, 10 pages.
Response to Office Action received for U.S. Appl. No. 10/761,625, filed on Jan. 18, 2008, 15 pages.
Office Action received for U.S. Appl. No. 10/761,625, mailed on Feb. 9, 2007, 10 pages.
Response to Office Action received for U.S. Appl. No. 10/761,625, filed on Mar. 2, 2009, 11 pages.
Office Action received for U.S. Appl. No. 10/761,625, mailed on Apr. 23, 2008, 11 pages.
Office Action received for U.S. Appl. No. 10/761,625, mailed on Apr. 28, 2009, 11 pages.
Response to Office Action received for U.S. Appl. No. 10/761,625, filed on May 2, 2007, 9 pages.
Response to Office Action received for U.S. Appl. No. 10/761,625, filed on Jun. 2, 2006, 9 pages.
Response to Office Action received for U.S. Appl. No. 10/761,625, filed on Jun. 6, 2008, 12 pages.
Advisory Action received for U.S. Appl. No. 10/761,625, mailed on Jun. 29, 2007, 3 pages.
Response to Advisory Action received for U.S. Appl. No. 10/761,625, filed on Jul. 9, 2007, 8 pages.
Office Action received for U.S. Appl. No. 10/761,625, mailed on Aug. 25, 2006, 10 pages.
Office Action received for U.S. Appl. No. 10/761,625, mailed on Sep. 30, 2008, 12 pages.
Response to Office Action received for U.S. Appl. No. 10/761,625, filed on Oct. 6, 2006, 10 pages.
Office Action received for U.S. Appl. No. 10/761,625, mailed on Oct. 19, 2007, 11 pages.
Office Action received for U.S. Appl. No. 10/761,625, mailed on Oct. 30, 2006, 9 pages.
Response to Office Action received for U.S. Appl. No. 10/761,625, filed on Nov. 20, 2006, 9 pages.
Notice of Allowance received for U.S. Appl. No. 11/503,035, mailed on Sep. 15, 2008, 4 pages.
Office Action received for U.S Appl. No. 11/503,035, mailed on Feb. 11, 2008, 15 pages.
Response to Office Action received for U.S. Appl. No. 11/503,035, filed on May 12, 2008, 6 pages.
U.S. Appl. No. 11/495,675 Final Office Action mailed Jul. 8, 2010, 16 pages.

* cited by examiner

POWER CONTROL FOR A DUAL MODE TRANSMITTER

TECHNICAL FIELD

This description relates to power control for transmission circuits.

BACKGROUND

In a dual mode wireless transmitter, a first mode of operation may have a first power requirement/characteristic, and a second mode may have a second power requirement/characteristic. Consequently, the different modes may make such a transmitter suitable for use in different devices/environments.

For example, the first mode may be used when the transmitter is installed in a gaming device, such as a joystick or other controller. In this mode of operation, the transmitter output power (e.g., 6 dBm) may be required to be sufficient to communicate with a gaming console across a limited range wireless connection (e.g., from a user to a nearby television or other monitor). Meanwhile, the second mode may be used, for example, where the transmitter is installed in a cellular application such as a cellular phone or a personal digital assistant (PDA). In this second mode of operation, the output power (e.g., 0 dBm) may be lower than in the first mode of operation, but may be amplified by an external, off-chip amplifier that is used to carry the signal to its intended destination.

Such a dual mode transmitter may be manufactured as part of an integrated circuit on a microchip (or "chip"), and, during development, manufacture, or production, may be configured for the desired output power for the intended application. In this way, the resulting chip may be used in different settings (such as, for example, the gaming or cellular settings just mentioned). To achieve this flexibility, however, the transmitter may be "over-designed" to some extent, since capabilities needed for one mode may not be needed (and hence, may be wasted) in the other mode. In particular, the ability to produce higher power in one mode may not be needed in the other mode, so that battery life may be unnecessarily reduced in the latter mode.

SUMMARY

According to one general aspect, a circuit includes an amplifier configured to provide amplification of a signal for transmission in either a first transmission mode or a second transmission mode, using power supplied from a power supply, the amplifier including at least one cascode transistor in series with at least one amplifying transistor. The circuit further includes a power controller configured to define an operating characteristic of the at least one cascode transistor, and thereby designate an amount of power from the power supply that is used by the amplifier during the amplification, based on whether the amplifier is to be operated in the first transmission mode or the second transmission mode.

According to another general aspect, a method includes providing an amplifier within a multi-mode transmitter, the amplifier powered by a power supply and including at least one cascode transistor in series with at least one amplifying transistor. The method further includes providing a first power control option defining an amount of power used by the amplifier in an operational mode of the transmitter and associated with a first operating characteristic of the at least one cascode transistor, and providing a second power control option defining an amount of power used by the amplifier in the operational mode of the transmitter and associated with a second operating characteristic of the at least one cascode transistor.

According to another general aspect, a method includes making a determination to operate a transmitter in a first operational mode or a second operational mode, the first operational mode requiring less power for operation of an amplifier of the transmitter than the second operational mode. The method further includes setting a bias level of a plurality of cascode transistors of the amplifier, based on the determination, setting a voltage level of a power supply of the amplifier, based on the determination, and designating a number of the plurality of cascode transistors to be active within the amplifier, based on the determination.

The details of one or more implementations are set forth in the accompanying drawings and the description below. Other features will be apparent from the description and drawings, and from the claims.

DETAILED DESCRIPTION

Figure 1:
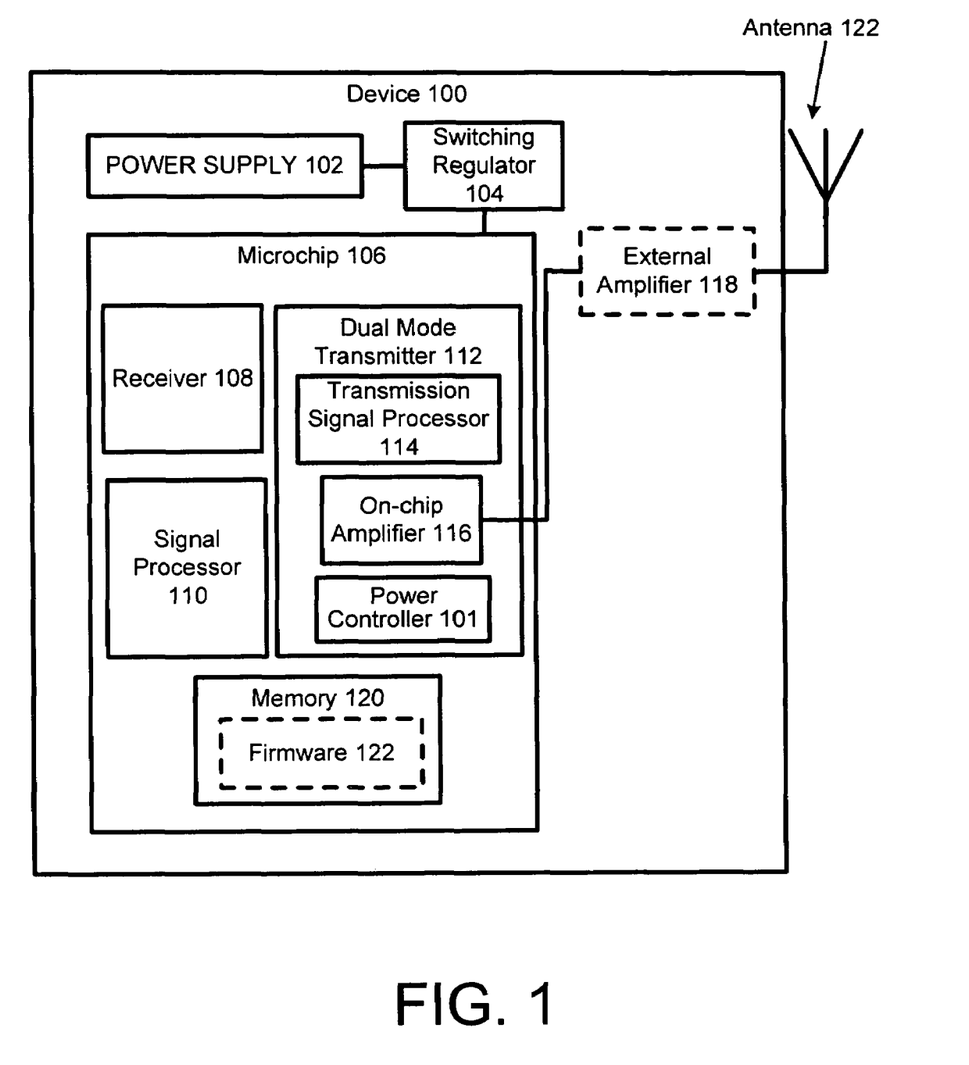
FIG. 1 is a block diagram of a device that includes a dual mode transmitter with a power controller.

FIG. 1 is a block diagram of a device 100 that includes a dual mode transmitter 112 with a power controller 101. The dual mode transmitter 112 is designed to function in at least two modes of transmission, and, more specifically, the power controller 101 is configured to ensure that power use in each mode may be optimized for that mode. As a result, for example, battery life for the device 100 may be improved, and an experience of a user of the device 100 also may be enhanced.

In FIG. 1, the power controller 101 is illustrated as a separate, individual component of the dual mode transmitter 112, but it will be appreciated that this illustration is conceptual and for the purposes of example/explanation, and is not intended to be limiting or representative of implementations of the power controller 101. More specific, detailed examples of how the power controller 101 may be implemented are provided herein, but, in general, it may be appreciated that the power controller 101 may include multiple circuit components that may be included at various locations on or off a microchip 106.

The power controller 101 provides a designer, manufacturer, producer, purchaser, or other user of the dual mode transmitter 112 with the ability to configure the dual mode transmitter 112 for use in at least two applications having different power requirements. For example, the power controller 101 may allow the designer or other user to configure an amount of power required or used by an on-chip amplifier 116 (the on-chip amplifier 116 is illustrated in FIG. 1 as a single element, but, as described and illustrated in more detail, below, may actually include more than one amplifier).

For example, the power controller 101 may be used to configure operating characteristics (e.g., a structure or operation) of transistors of the on-chip amplifier 116 (not shown in FIG. 1, but discussed and illustrated below, for example, with respect to FIGS. 3-5). More generally, the power controller 101 may be used, for example, to configure an amount of voltage or current that is used by the on-chip amplifier 116 during operation thereof in each of at least two modes.

For example, the power controller 101 may configure the on-chip amplifier 116 for a first operating mode, which may be a "high linearity" mode or "high power" mode. In this first mode of operation, a relatively high output power, (such as an output power of around 6 dBm), may be used to communicate across a limited range wireless connection, such as when the device 100 includes a gaming console.

The power controller 101 also may configure the on-chip amplifier 116 for a second operating mode, which may be a "low linearity" mode or "low power" mode. In this second mode of operation, the on-chip amplifier 116 may be configured for a relatively low output power, (such as an output power of around 0 dBm). More specifically, in such an instance, an external, off-chip amplifier 118 may be used by the device 100, such as when the device 100 includes a cellular phone or a personal digital assistant (PDA), for example.

In the example of FIG. 1, the device 100 is illustrated to include various elements that are discussed in more detail herein, as well as other, related features and functions of the device 100, which may vary in known ways, depending on the particular implementation of the device 100. For example, the dual mode transmitter 112 is illustrated generically, and may include virtually any such dual mode transmitter that may benefit from the power control features described herein. For example, the dual mode transmitter 112 may include a transmitter associated with one or more of the 802.11x family of wireless communications standards (as discussed and illustrated in more detail with respect to the examples of FIGS. 8 and 9).

More generally, as shown, the device 100 may include a power supply 102, a switching regulator 104, the microchip 106, the external amplifier 118, and an antenna 122. The power supply 102 may represent any suitable power supply, e.g., a battery, or may represent power derived from or provided by a battery. As is well-known, a power provided by the power supply 102 may be expressed as being equivalent to a current drawn from the power supply 101 multiplied by a voltage provided by the power supply 101 (that is, Power=(current)(voltage)=I*V).

The switching regulator 104, as described in more detail below, may be used by the power controller 101 (or may be considered to be a component of the power controller 101) to reduce an amount of voltage from the power supply 102 that is provided to the dual mode transmitter 112. Further, the antenna 122 may represent any standard antenna that is suitable for a particular implementation of the device 100.

The microchip 106 may include a signal processor 110, a receiver 108, the dual mode transmitter 112, and a memory 120. As should be appreciated from the above discussion, these elements should be considered representative and not limiting; for example, the receiver 108 may be omitted or may be implemented together with the dual mode transmitter 112 to form a transceiver. The signal processor 110 may perform any signal processing that may be associated with the performance of the device 100, such as, for example, analog-to-digital conversion, demodulation, or filtering of a signal received by the receiver 108.

The dual mode transmitter 112 may include a transmission signal processor 114 that may perform similar, related, or complementary functionality as the signal processor 110, but that is shown separately in FIG. 1 for the purposes of illustration and discussion. The transmission signal processor 114 may include or represent, for example, a digital-to-analog converter and/or modulator or other device to assist in transmitting a signal from the dual mode transmitter 112 (as shown in more detail in the examples of FIG. 8).

In some implementations, such as in the high power/high linearity mode referenced above, the on-chip amplifier 116 may be sufficient to amplify signals from the dual mode transmitter 112 for transmission. In this case, the external, off-chip amplifier 118 may not be required. Instead, the power controller 101 may be used to configure the on-chip amplifier 116 for the high-power/high-linearity mode, and the device 100 (e.g., gaming console) may thereafter be operated accordingly.

In other example implementations, the on-chip amplifier 116 may simply be incapable of providing sufficient amplification for the signal to be transmitted, and the external amplifier 118 may be used. For example, the on-chip amplifier 116 may use complementary metal-oxide-semiconductor (CMOS) transistors that are only capable of handling certain maximum power levels. In such cases, the design approach may be to reduce or eliminate the amplification provided by the on-chip amplifier 116, since such amplification will be insufficient, and to rely (perhaps completely) on the external amplifier 118 for the desired amplification. In such cases, the power controller 101 may be used to configure the on-chip amplifier 116 accordingly; e.g., to configure the on-chip amplifier 116 for the low-power/low-linearity mode referenced above.

In so doing, certain settings used by, or set by, the power controller 101 may be saved in, and/or retrieved from, a memory 120. For example, when configuring the on-chip amplifier 116 for low-power/low-linearity mode, the power controller 101 may access the memory 120 to determine settings for this mode, and may, for example, configure operating characteristics of transistors of the on-chip amplifier 116 and/or may modify the switching regulator 104 accordingly to provide lower power than in the high-power, high-linearity mode.

The memory 120 may include, for example, various known types of registers, read only memory (ROM), random access memory (RAM), flash memory, or virtually any appropriate memory type, or combinations thereof. The memory 120 is illustrated on the chip 106 in FIG. 1, but it should be apparent that some or all of the memory 120 may be available on the device 100 off of the chip 106 (e.g., in a separate chip, not shown). There are various, known trade-offs related to where and how to construct the memory 120, since, for example, putting the memory 120 on the chip 106 provides for faster and easier access for the power controller 106, but also consumes valuable space on the chip 106 that may be used for other purposes. Consequently, various known compromises exist and may be implemented, such as, for example, an on-chip cache memory complemented by an off-chip memory.

In FIG. 1, the memory 120 includes firmware 122, which generally represents stored code or settings that may be defined and stored during an initial configuration, design, or set-up for the chip 106, and that then may be automatically implemented thereafter whenever a user (e.g., a consumer) activates the device 100. In this way, the device 100 may be configured by a designer, manufacturer, or producer, while an involvement or knowledge of such configuration by the end-user (e.g., consumer) may be minimized.

Figure 2:
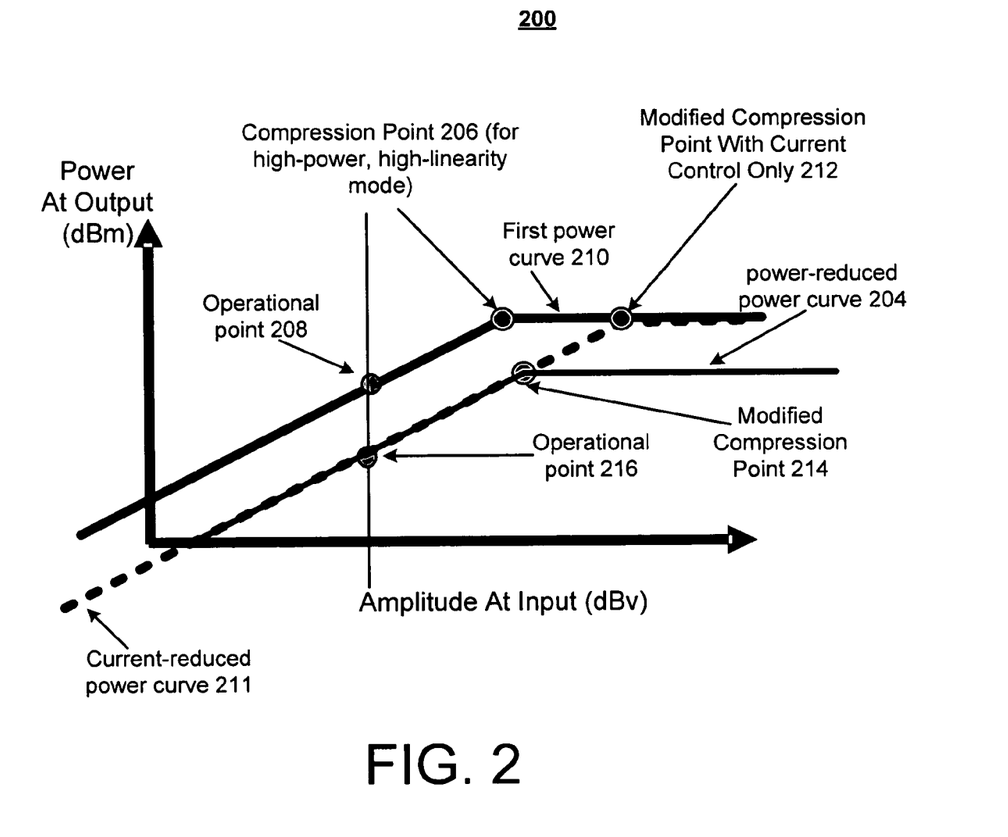
FIG. 2 is a chart illustrating a power output for the dual mode transmitter with a power controller of FIG. 1.

FIG. 2 is a chart 200 showing a power output(s) for the dual mode transmitter 112 with the power controller 101 of FIG. 1. More specifically, FIG. 2 is included to illustrate and explain example effects of the power controller 101 in configuring the dual mode transmitter 112, e.g., in configuring the on-chip amplifier 116. Techniques for achieving the results of FIG. 2 are provided and discussed in more detail, below, with respect to FIGS. 3-7.

In the example of FIG. 2, the y-axis of the chart 200 includes the power that may be output from the on-chip amplifier 116 (e.g., from an output or driving amplifier of a plurality of amplifiers represented by the on-chip amplifier 116 in FIG. 1). The x-axis of the chart 200 includes the input driving strength associated with such an output/driving amplifier.

In the example of FIG. 2, a first power curve 210 is illustrated that is associated with operation of the on-chip amplifier 116 in the high-power/high linearity mode. It is assumed for this example that the power curve 210 is associated with signal(s) transmitted using orthogonal frequency-division multiplexing (OFDM), although, of course, other types of multiplexing or signal processing may be used.

Such OFDM signals, as is known, may have relatively large amplitude swings around an operational mid-point. That is, OFDM signals may typically have relatively large peak-to-average ratios, meaning the signal varies in power over time and the peak output may be relatively large compared to the average output. For example, in FIG. 2, the power curve 210 has an operational point 208. In order to maintain a full fidelity of the associated OFDM signal, then, a linear region of the power curve 210 below a compression point 206 must be maintained at a certain magnitude/extent, so that sufficient range is available for the associated OFDM signal to oscillate to peak value(s).

In more detail, it will be appreciated that the relevant amplifier(s) of the on-chip amplifier 116 may essentially be non-linear device(s) that are designed for (limited) linear operation. That is, as is known, the amplifier(s) may be operated in a linear region, however, in so doing, a compression point may be reached at which this linearity becomes insufficient (e.g., an increasing input no longer translates into a proportionally increasing output). Beyond this compression point (e.g., the compression point 206), the fidelity of the signal (e.g., the OFDM signal corresponding to the power curve 210) may not be reliably maintained.

As the nature and function of amplifiers and associated compression points are well-known, fuller discussion is not provided here, except to say that a location/position of the compression point 206 (and thereby, an extent of linear operation of the associated amplifier) may be altered by modifying an amount of power available to the amplifier. For example, at a cost of requiring more power, the compression point 206 may be raised in FIG. 2, so as to extend a linear region available to the power curve 210.

The transmitter 112 may thus be designed to operate at a certain level below a corresponding compression point, in order to accommodate for the large peak to average swings referenced above. For example, a transmitter with a 16 dBm compression point and a peak to average ratio of 10 dBm may be designed for an average/mid-point output power of 6 dBm, to account for the potential 10 dBm swing as the power output of the OFDM signal varies (i.e., up to 16 dBm and down to −4 dBm).

In FIG. 2, the power curve 210, as mentioned above, is associated with a high-power, high-linearity mode of the dual mode transmitter 112. As may be appreciated from FIG. 2, the reference to a high-linearity mode may be seen to correspond to an extent to which the power curve 210 is linear before reaching the compression point 206.

In operation, then, the power controller 101 of FIG. 1 may be used to configure the chip 106 to use less power from the power supply 102 when operating in a second, low-(output) power, low-linearity mode. The power controller 101 may reduce power from the power supply 102 in one or both of at least two ways, e.g., by lowering a voltage associated with the power supply 102, and/or by lowering current drawn from the power supply 102. Techniques for reducing the voltage and/or current from the power supply 102 are described in more detail below, e.g., with respect to techniques for configuring operating characteristics of transistors of the on-chip amplifier 116. FIG. 2, however, merely shows example effects or results of such techniques.

For example, FIG. 2 illustrates a (dashed-line) current-reduced power curve 211, which corresponds to a situation in which the power controller 101 reduces an amount of current drawn from the power supply 102 by the on-chip amplifier 116. As shown, a result of such an operation may include a lowering of the operational point 208 to a reduced operational point 216, and a modification of the compression point 206 to a modified compression point 212 A second example illustrated in FIG. 2 reflects a situation in which the power controller 101 also reduces a voltage associated with the power supply 102 (in addition to lowering the current), resulting in a (solid line) power-reduced power curve 204 and a corresponding modified compression point 214. It would also be possible to illustrate a power curve corresponding to the power curve 210, with the voltage of the power supply 102 reduced but not the current, which would lower the compression point 206 along the power curve 210.

Thus, considering the combination of the above techniques/examples, FIG. 2 and the above discussion illustrate that reduction of both (or either) current and voltage used by the on-chip amplifier 116 allows for a reduced power drawn from the power supply 102. That is, as will also be appreciated from the above-referenced definition of power as (current)* (voltage), using the power controller 101 to reduce one or both of the current and voltage also may be performed to gain some benefit of a reduced consumption of power from the power supply 102.

Such a power reduction(s) also results in (or is associated with) a reduced output power of the transmitter 112, reduced linearity of the on-chip amplifier 116, and/or a reduced compression point of the power curve(s) of FIG. 2. It should be understood, however, that such reductions are acceptable or desirable if, for example, the device 100 is presumed to have lower requirements for these parameters (e.g., when the device 100 includes a cell phone that relies on the external amplifier 118 for sufficient signal amplification, and therefore does not require a particularly high linear region, output power, or compression point). Techniques for obtaining the power curves 204, 210, or 211, or other power curves, are described in more detail below with respect to FIGS. 3-7.

Figure 3:
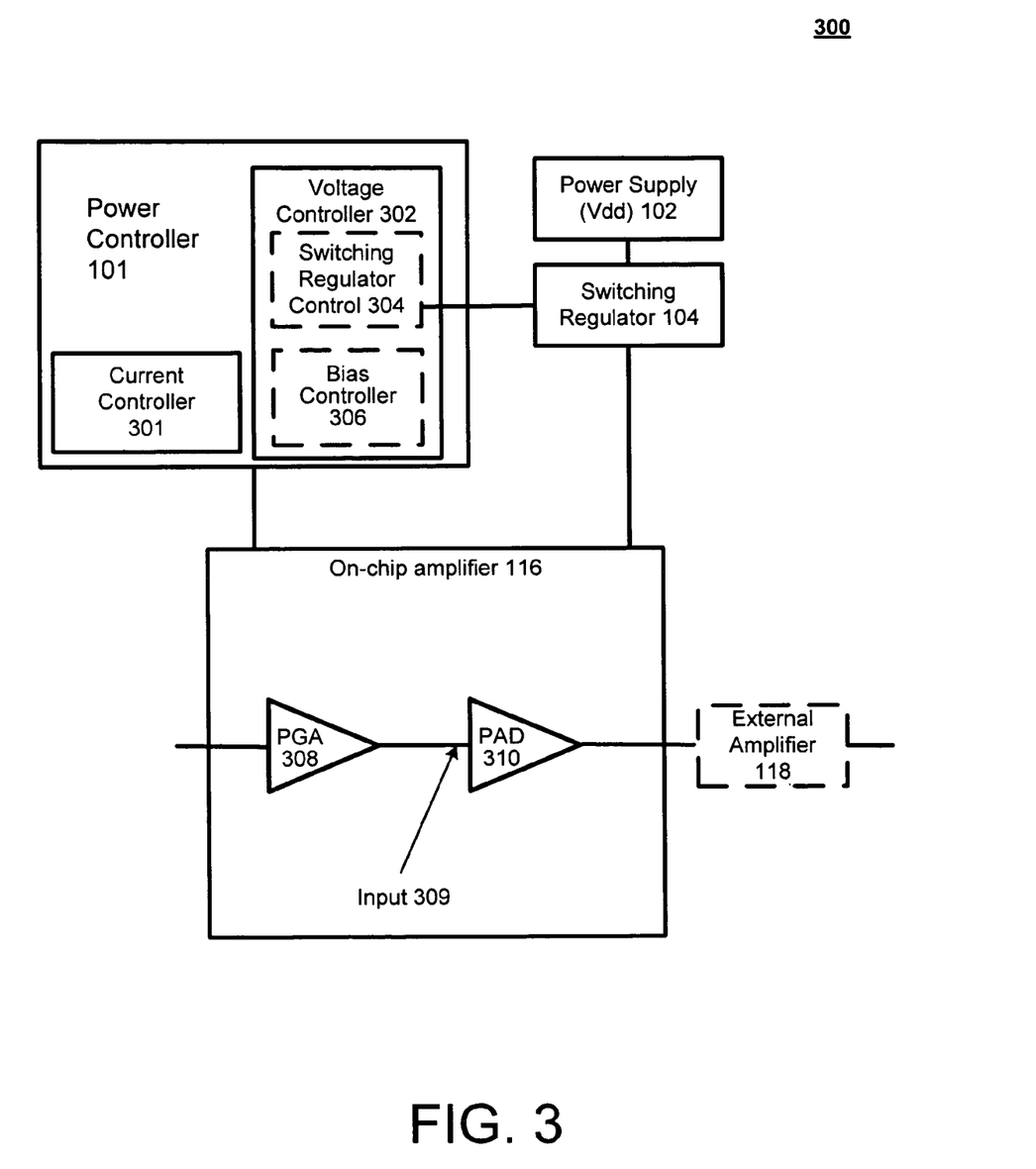
FIG. 3 is a block diagram illustrating more detailed examples of the power controller and the on-chip amplifier of FIG. 1.

FIG. 3 is a block diagram 300 illustrating more detailed examples of the power controller 101 and the on-chip amplifier 116 of FIG. 1. FIG. 3 also illustrates the power supply 102, the switching regulator 104, and the external amplifier 118 of FIG. 1.

In FIG. 3, and consistent with the above discussion of FIG. 2, the power controller 101 is illustrated as including a current controller 301 and a voltage controller 302. As referenced above, one or both of the controllers 301, 302 may be used to configure the on-chip amplifier 116, so that the on-chip amplifier 116 uses no more than an appropriate/necessary amount of power (i.e., current and/or voltage) from the power supply 102, depending on a mode of operation of the dual mode transmitter 112. Thus, for example, the on-chip amplifier 116 may be configured to operate according to a desired one of the power curves 204, 210, 211 of FIG. 2, or other desired power curves.

In FIG. 3, the on-chip amplifier 116 is illustrated as including a programmable gain amplifier (PGA) 308 and an amplifier driver, such as a power amplifier driver (PAD) 310. Various operations of the on-chip amplifier 116, including the PGA 308 and the PAD 310, are known, and examples are provided in more detail below, e.g., with respect to FIGS. 8 and 9. In general, though, it may be appreciated that the PGA 308 may be used, e.g., by the transmission signal processor 114, to control an output of the PAD 310. In other words, the PGA 308 provides an input driving signal having a given input driving strength, which is amplified by the PAD 310 and/or by the external amplifier 118.

In this regard, it should be understood that it is possible to obtain a lower output power from the PAD 310 simply by reducing a driving strength (output) of the PGA 308, represented in FIG. 3 by an input 309. With reference to the power curve 210 of FIG. 2, it may be appreciated that an effect of such a modification would be to lower the operational point 208 along the power curve 210, without lowering either the power curve 210 itself (along the y-axis) or the compression point 206. In other words, such a solution, although effective for operating the device 100 (i.e., the dual mode transmitter 112) in a low-power, low-linearity mode, continues to use unneeded (and hence wasted) power from the power supply 102 to maintain the compression point 206 in its illustrated position in FIG. 2.

Thus, as an alternative or addition to such techniques, the power controller 101 may designate an amount of power from the power supply 102 that is used by the PAD 310, e.g., by appropriately defining an operating characteristic(s) of transistors of the PAD 310, and/or by adjusting an operation of the switching regulator 104, so that only a necessary or desired current and/or voltage of the power supply 102 is/are used.

For example, PAD 310 may include a number of transistors (e.g., cascoded transistors, as explained in various examples, below), and the current control 202 may be configured to include or exclude a desired number or type of these transistors, to thereby control a current drawn from the power supply 102. Additionally, or alternatively, the voltage controller 302 may include a switching regulator control 304 and a bias controller 306. Then, by appropriate biasing of certain ones of the transistors of the PAD 310 by the bias controller 306, the switching regulator controller 304 may be enabled to cause the switching regulator 104 to reduce an amount of voltage of the power supply 102 (and supplied to the PAD 310 therefrom). By these or similar operations of the power controller 101, the power curve(s) 204 and/or 211 of FIG. 2 may be obtained for operation of the dual mode transmitter 112 in a low-power, low-linearity mode.

Figure 4:
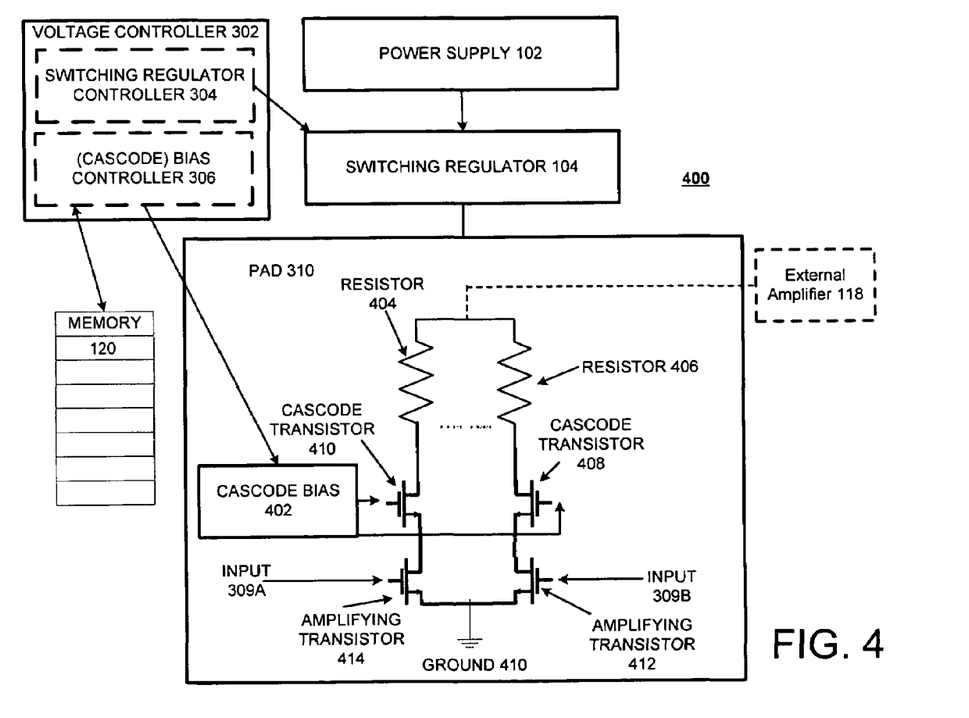
FIG. 4 is a block diagram illustrating a more detailed example of a power amplifier driver of the on-chip amplifier of FIG. 1.

FIG. 4 is a block diagram 400 illustrating more detailed examples of operations of the voltage controller 302 of FIG. 3 with regard to the PAD 310. As referenced above, the voltage controller 302 may be configured to bias the PAD 310 appropriately, and to operate the switching regulator 104 so as to lower a voltage from the power supply 102.

Specifically, in FIG. 4, the PAD 310 is illustrated as including a differential CMOS amplifier having differential amplifying transistors 412, 414 that receive the signal 309 (shown in FIG. 4 as 309A and 309B) from the PGA 308. Cascode transistors 408, 410 are illustrated that essentially act as switches for current drawn through the amplifying transistors 412, 414, in accordance with a cascode bias 402.

Load resistors 404 and 406 are also included, as shown. The resistors 404 and 406 may represent actual resistors or other devices, such as, for example, inductors or transistors, that may be tuned or otherwise operated so as to provide a desired resistive load (as referenced below with respect to FIGS. 8 and 9).

A general operation of differential amplifier(s), including the example differential amplifier of FIG. 4, is well-known. Consequently, operations of the differential amplifier circuit of the PAD 310 in amplifying the signal 309 are not discussed here further in detail, except to describe points of differentiation from conventional differential amplifier circuits and/or for the understanding of example operations of the power controller 101.

Thus, in FIG. 4, the voltage controller 302 may be used to operate the PAD 310 in either of the two modes described above, e.g., the high-power, high-linearity mode, or the low-power, low-linearity mode. In so doing, the voltage controller 302 may be used to bias the cascode transistors 408, 410 as described hereinbelow (e.g., using the bias controller 306), and also may operate the switching regulator 104 (using the switching regulator controller 304) to set (e.g., increase or reduce) the voltage from the power supply 102.

As described in more detail below, an example technique for (partially) enabling the various biasing schemes of the bias controller 306 includes providing the cascode transistors 408, 410 as thick oxide devices. As such, the cascode transistors 408, 410 are thus better able to withstand higher voltages without gate breakdown. Consequently, the cascode combination has better gate breakdown voltage than if thin oxide transistors were used. Inclusion of the cascode transistors 408, 410 as thick oxide devices, however, may require corresponding adjustments of the cascode bias 402, as described in more detail, below.

It should be understood that "thin" versus "thick" gate oxide devices may generally be defined relative to one another, and an absolute thickness of either type of device may vary, for example, based on a manufacturing process or other setting(s). For example, a thickness of a gate oxide device may vary depending on whether the underlying microchip is manufactured using 90 nm or 130 nm CMOS design (e.g., oxides in the 130 nm setting may range from about 1-6 nm). In some example implementations, a thick gate oxide may include a gate oxide that is approximately twice a thickness of a thin gate oxide device.

Thus, in a low-power, low-linearity mode, the power supply 102 may produce a supply voltage of 1.2V, while in a high-power, high-linearity mode, the power supply 102 may produce a supply voltage of 2.7V. Of course, these are just example values for the sake of illustration, and other values may be used.

For the low-power, low-linearity mode in this example, and assuming that the amplifying transistors 412, 414 are conventional 1.2V devices, the bias controller 306 may set the cascode bias 402 equal to 1.2V, or the voltage Vdd of the power supply 102. The switching regulator controller 304 may be used to cause the switching regulator 104 to output 1.2V, even where the power supply 102 is such that higher voltages are available.

Figure 8:
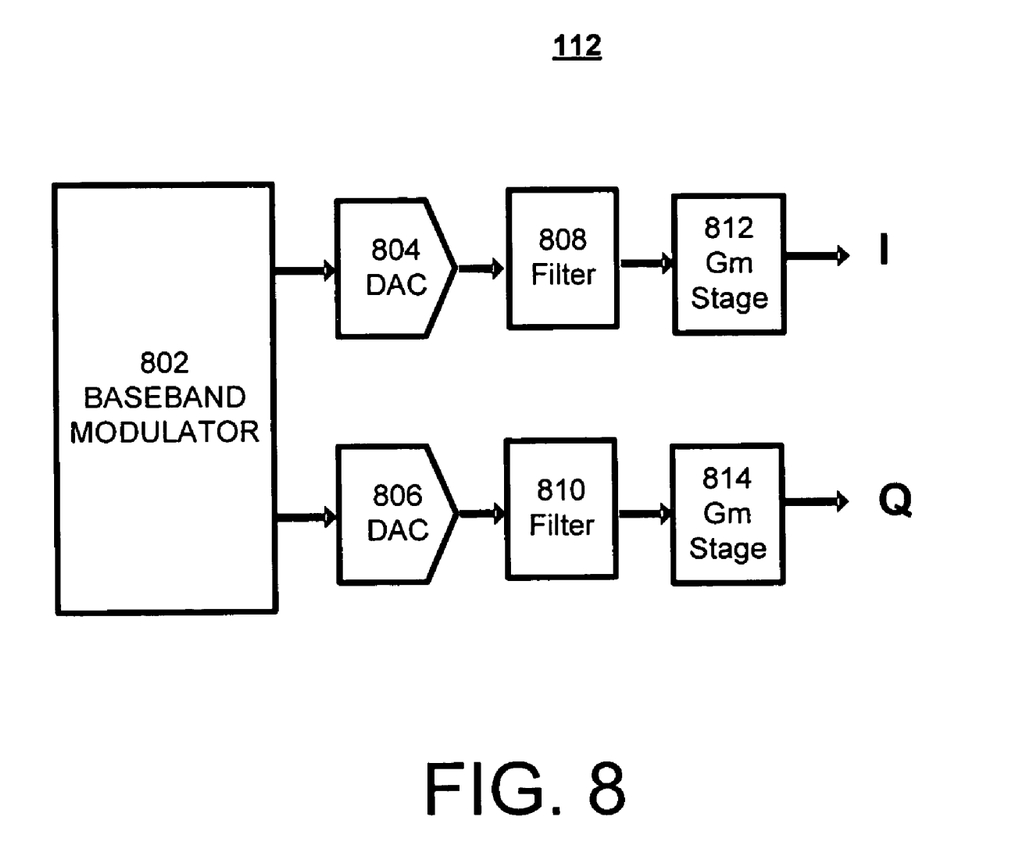
FIG. 8 is a block diagram of an example of the dual mode transmitter of FIG. 1.
Figure 9:
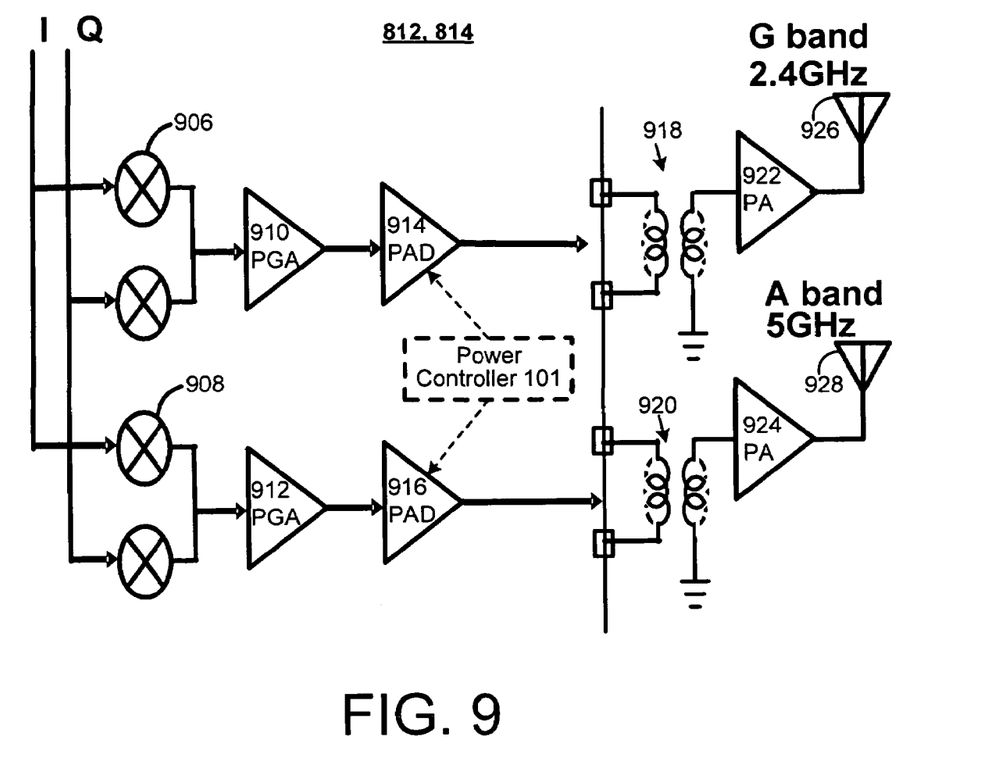
FIG. 9 is a block diagram of additional circuitry of the dual mode transmitter of FIG. 8.

For the high-power, high-linearity mode, the switching regulator controller 304 may set the switching regulator 104 to output 2.7V. In this case, the above-referenced biasing scheme for the cascode bias 402 may not be feasible. For example, in example configurations (e.g., as shown in FIGS. 8 and 9, below), the voltage Vdd may be passed through and seen at the cascode transistors 408, 410 (e.g., where the cascode transistors 408, 410 have an inductive load that passes DC voltage).

Consequently, as described above, thick oxide devices may be used as the cascode transistors 408, 410. However, as the amplifying transistors 412, 414 remain as normal, thin oxide, 1.2V devices, the cascode bias 402 should be selected to ensure that the amplifying transistors 412, 414 continue to operate normally and reliably (e.g., the amplifying transistors 412 and 414 may continue to operate as 1.2 volt devices even though the power supply 102 may be operating for high voltage devices). For example, the cascode bias 402 may be selected such that a drain(s) of the amplifying transistors 412, 414 is/are 1.2V during operation of the PAD 310.

In this regard, the cascode bias 402 may be set to achieve this result. For example, a relationship between a gate and source of each of the cascode transistors 408, 410 may be determined, and then adjusted by the desired result (e.g., 1.2V) to obtain the required cascode voltage. For example, if the gate/source relationship is determined to be 0.8V (which may vary based on device geometry and other factors), then the cascode bias 402 may be set at 2V in order to set the drain(s) of the amplifying transistors 412, 414 at the desired 1.2V.

In some example implementations, a number of possible cascode bias levels may be selected, known, or otherwise determined, and then may be stored in the memory 120 (e.g., in the firmware 122 of FIG. 1). In this way, for example, when the PAD 310 is to be used in a high-power, high-linearity setting and the voltage of the power supply 102 is relatively high (e.g., 2.7V), then an appropriate, corresponding cascode bias may be selected from the memory 120 by the bias controller 306 and applied as the cascode bias 402.

Figure 5:
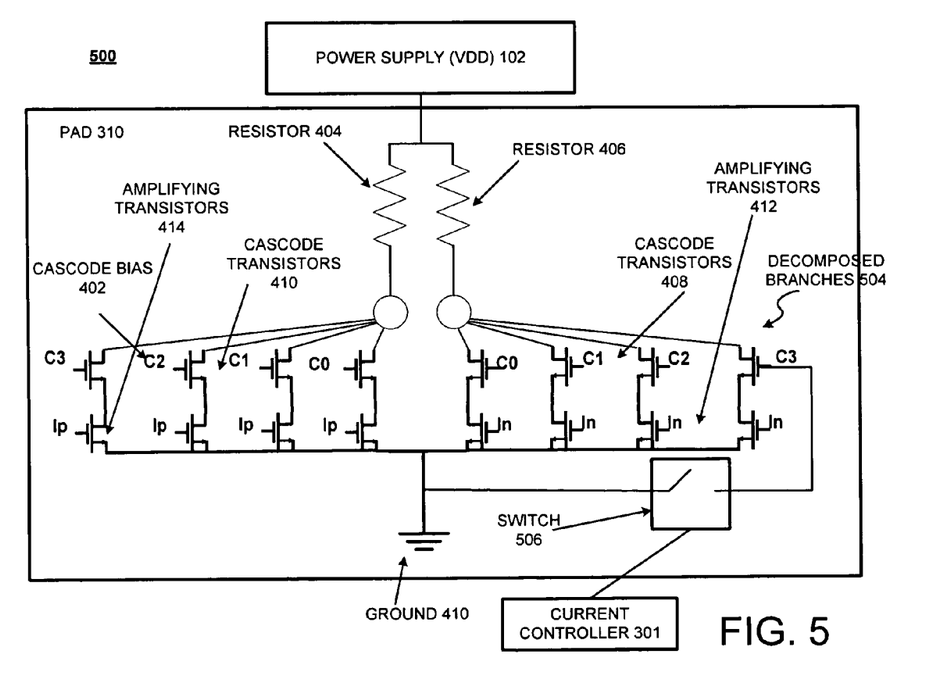
FIG. 5 is a more detailed block diagram of the power amplifier driver of FIG. 4.

FIG. 5 is a more detailed block diagram of an example of the power amplifier driver of FIG. 4, with respect to which the current controller 301 is explained in further detail. In FIG. 5, the differential amplifier design of FIG. 4 is illustrated as being split, or decomposed, into a number of parallel branches 504. These decomposed branches 504 allow for some maximum amount of current to flow therethrough, and the current controller 301 may reduce this maximum current, as desired, by disabling a corresponding number of the branches 504.

For example, in a high-power, high-linearity mode, all (or a large number) of the branches 504 may be enabled and turned on, so that the maximum current may flow. Conversely, in the low-power, low-linearity mode, the current controller 301 may calculate that only half (or some other appropriate percentage) of the branches 504 are required to produce a desired (reduced) current. In this case, the current controller 301 may disable the other half of the branches 504, so that these disabled branches appear as open circuits, and current drawn from the power supply 102 is reduced, so that the required power therefrom is also reduced.

In the example of FIG. 5, the branches may be disabled (open-circuited) by configuring a selected number of the cascode transistors 408, 410 such that the cascode bias (gate) is connected to ground 410. This example assumes that the cascode transistors 408, 410 are NMOS transistors that are open circuits in this configuration; however, other corresponding configurations may be selected for other transistor types.

In FIG. 5, the current controller 301 operates by opening or closing a switch 506 that connects a gate of a selected one of the cascode transistors 408 to ground. Of course, other techniques may be used to disable the cascode transistors 408, 410. Moreover, in the example of FIG. 5, only the single switch is illustrated. It should be understood, however, that a switch or corresponding element may be included for some or all of the cascode transistors 408, 410, and typically may be included in a symmetrical fashion with regard to the two sets of decomposed transistors 408, 410 (to maintain a symmetry of the larger differential circuit design).

Although not specifically illustrated in FIG. 5, it should be understood that the current controller 301 also may use the memory 120, in a manner analogous to that of the voltage controller 302. For example, a number of the branches 504 that are to be turned off may be stored in the memory 120 or the firmware 122, for access by the current controller 301 during start-up of the device 100 or the chip 106. In other examples, the number of branches 504 to be turned off may be set by hard-wiring the chip 106 in a desired fashion.

Although discussed as separate elements in FIG. 5 for clarity, it should be appreciated that the switch 506 and the memory 120 may be considered to be part of the current controller 301, inasmuch as these elements are involved in setting/controlling the current through the cascode transistors 408. Analogously, in FIG. 4, the switching regulator 104 and the memory 120 may be considered to be part of the voltage controller 302, inasmuch as the switching regulator controller 304 and the bias controller use these elements in setting/controlling a voltage from the power supply 102.

It should be understood from the above description of FIG. 4 that all of the cascode transistors 408 and 410 may be thick oxide devices, for example. The amplifying transistors 412 and 414 may be thin oxide devices, for example. In the case where there are multiple branches 504, as in FIG. 5, the bias controller 306 may continue to bias the cascode transistors 408, 410 in the manner described above, depending on a current operation mode of the dual mode transmitter 112.

Figure 6:
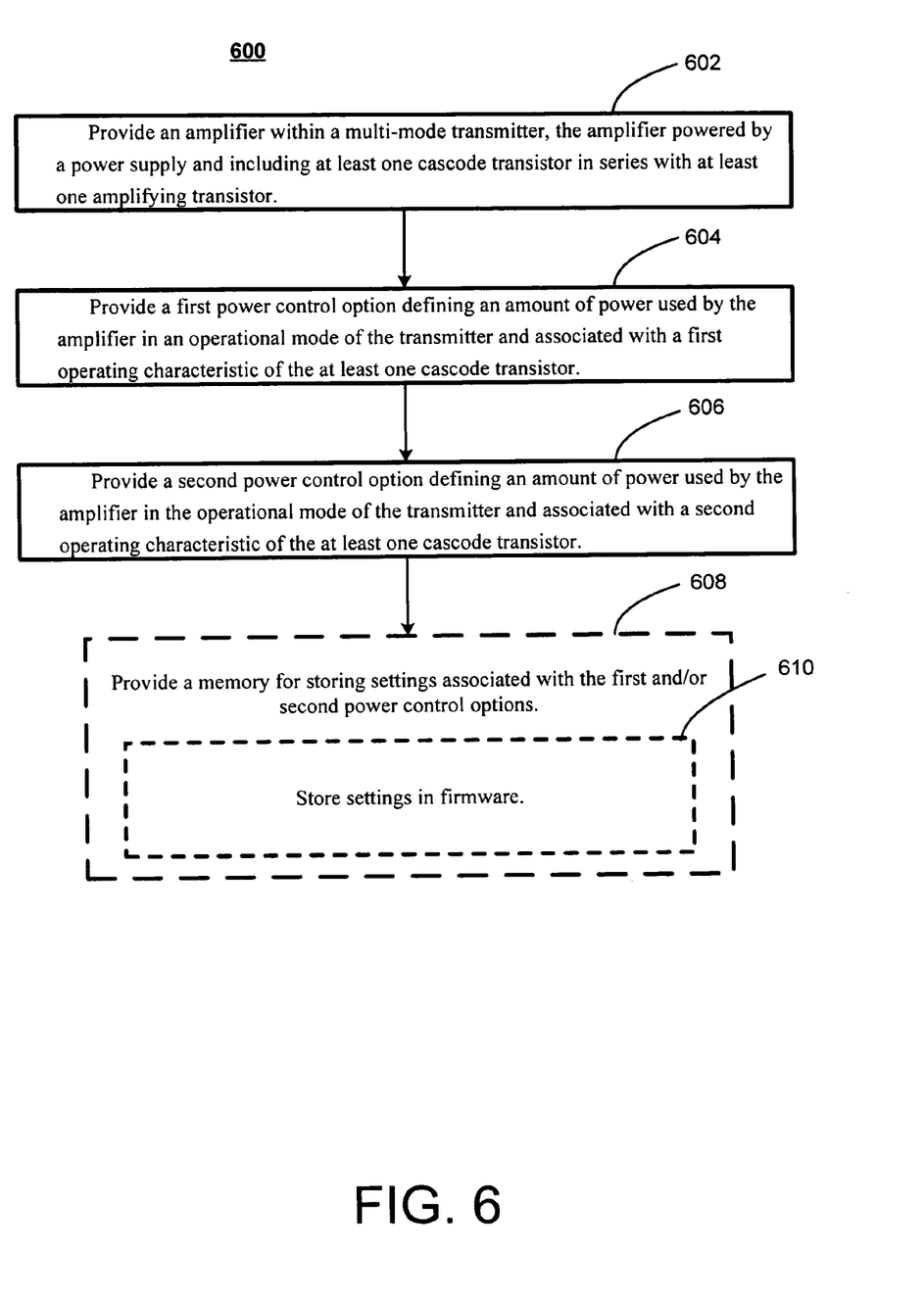
FIG. 6 is a flowchart illustrating example operations that may be involved in providing the dual mode transmitter with a power controller of FIG. 1.

FIG. 6 is a flowchart 600 illustrating example operations that may be involved in providing the dual mode transmitter 112 with the power controller 101 of FIG. 1. As should be understood, the techniques described herein, including the operations of FIG. 6, may allow a designer of the dual mode transmitter 112, and/or of the chip 106, to provide a single chip that allows for both modes of the dual mode transmitter 112, but that limits the amount of power from the power supply 102 to what is actually needed for each mode.

In the example of FIG. 6, then, an amplifier may be provided within a multi-mode transmitter, the amplifier being powered by a power supply and including at least one cascode transistor in series with at least one amplifying transistor (602). For example, as shown in FIGS. 4 and 5, the PAD 310 may include the cascode transistors 408, 410, as well as the amplifying transistors 412, 414.

A first power control option may be provided for defining an amount of power used by the amplifier in an operational mode of the transmitter and associated, for example, with a first operating characteristic of the at least one cascode transistor (604). For example, a chip designer or producer may provide the first power control option as part of the design of the chip 106. The first power control option may be implemented by the voltage controller 302, and the first operating characteristic of the at least one cascode transistor may include the nature of the cascode transistors 408, 410 as thick oxide devices, and/or may include the cascode bias 402. The first power control option also may include a voltage control related to changing a voltage of the power supply 102, once the cascode bias is configured correctly, so that the first operating characteristic of the cascode transistors 408, 410 also may include such voltage control. The first operational mode may include either the high-power, high-linearity mode, or the low-power, low-linearity mode.

A second power control option may be provided for defining an amount of power used by the amplifier in the operational mode of the transmitter, the second power control option being associated with a second operating characteristic of the at least one cascode transistor (606). As referenced above, the chip designer or producer may provide the second power control option as part of the design of the chip 106. The second power control option may include a current control, e.g., such as when the current controller 301 enables or disables a number of the decomposed branches 504 of a cascode device, for example. In this context, then, the at least one cascode transistor may include the plurality of cascode transistors 408, 410 in the decomposed branches 504, and the second operating characteristic thereof may represent or include whether each one of the cascode transistors 408, 410 is grounded, operational, or otherwise configured.

A memory may be provided for storing settings associated with the first and/or second power control options (608). For example, the memory 120 may be used to store information, e.g., about the first or second operating characteristics of the cascode transistors 408, 410, and such settings also may be stored in the firmware 122 (610). In this way, for example, the settings (e.g., possible settings for the cascode bias 402, or for the number of the decomposed branches 504 to be open-circuited in a given circumstance) may be available automatically upon start-up of the device 100, without requiring configuration by a user.

Figure 7:
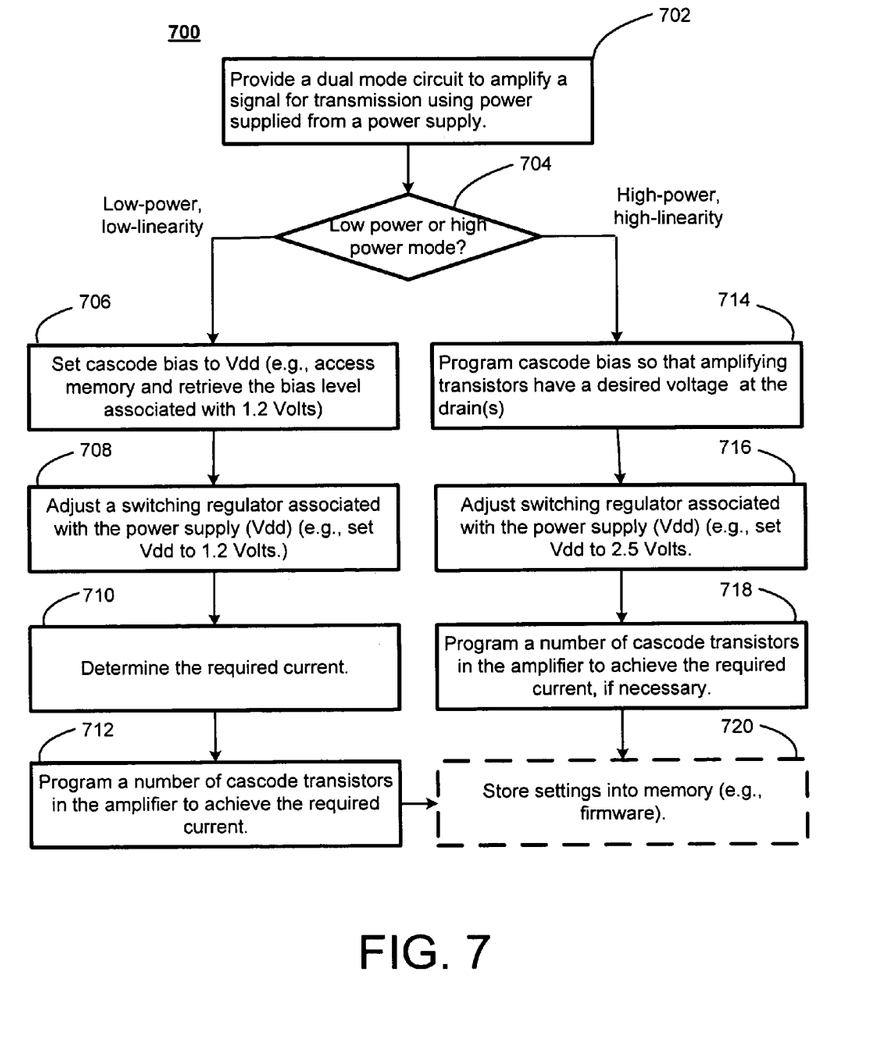
FIG. 7 is a flowchart illustrating example operations that may be involved in implementing the dual mode transmitter with a power controller of FIG. 1.

FIG. 7 is a flowchart 700 illustrating example operations that may be involved in providing the dual mode transmitter 112 with the power controller 101 of FIG. 1. Consistent with FIG. 6 and the above description, FIG. 7 illustrates a number of techniques by which the chip 106, including the dual mode transmitter 112, may be configured and designed. It will be appreciated that such operations, as referenced above, may be performed in whole or in part by one or more of a chip designer, producer, manufacturer, or customer (e.g., a customer purchasing the chip 106 for inclusion thereof in the device 100). In any of these cases, however, it will be appreciated that the resulting chip 106 provides at least two transmission modes, each mode being optimized (or optimizable) for power consumption.

Thus, a dual mode circuit may be provided to amplify a signal for transmission using power supplied from a power supply (702). For example, some or all of the operations of FIG. 6 may be performed in order to provide one or more of the entities just mentioned with the possibility of selecting one of the at least two available modes.

Then, one or more of these entities may be involved in a decision as to whether the resulting circuit(s) (chip 106 and transmitter 112) is to be operated in a low-power (low linearity) mode or a high-power (high-linearity) mode (704). For example, a manufacturer of a cell phone may wish to operate the dual mode transmitter 112 in the low-mode, low-linearity mode, while a manufacturer of the device 100 as a gaming console may wish to operate the dual mode transmitter 112 in the high-mode, high-linearity mode.

If the circuit is to be operated in the low-power, low-linearity mode, then a cascode bias may be set to be the same or substantially the same as the power supply (706). For example, as explained above with respect to FIG. 4, the cascode bias 402 may be set to 1.2V for 1.2V amplifying transistors 412, 414.

A switching regulator associated with the power supply may be adjusted, if necessary (708). For example, the switching regulator controller 304 may be used to set the switching regulator 104 so that a voltage from the power supply 102 may be set to 1.2 Volts.

For example, in operation, the switching regulator 104 may be a known switching regulator that is operable to provide a certain, fixed efficiency, such as a percentage defined by (a power provided to the PAD 310)/(power supply 102). For example, if the efficiency of the switching regulator is 0.5, and the PAD 310 consumes 100 mW of power, then the power consumption of the power supply 102 (e.g., battery) would be 200 mW. If the PAD 310 consumes only 50 mW, then the switching regulator 104 having 0.5 efficiency would result in 100 mW of power consumption of the power supply 102. Other techniques or components also may be used to reduce a voltage (and power) of the power supply 102.

The required current may be determined (710). For example, since the low-power, low-linearity mode is desired in this example, a lower current than a maximum available current may be sufficient, since, with reference to FIG. 2, a lower compression point and linear range may be sufficient for the application. The current controller 301 or other appropriate elements, and/or human calculation or testing, may be used to determine an appropriate amount of current for the given application.

Then, a number of cascode transistors in the amplifier may be programmed or otherwise configured to achieve the required current (712). For example, the amount of current may be matched to a number of the cascode transistors 408, 410 in the branches 504, and the current controller 301 may be used to disable (i.e., open-circuit) a necessary number of the cascode transistors 408, 410 to match the required current. For example, as explained above with regard to FIG. 5, a corresponding number of the cascode transistors 408, 410 may be connected to ground.

If, on the other hand, the manufacturer or other entity wishes to operate the dual mode transmitter 112 in the high-power, high-linearity mode (704), then the cascode bias may be programmed so that the amplifying transistors have a desired voltage at the drain(s) (714), e.g., a voltage equal to 1.2V that matches a normal operating scheme of the amplifying transistors 412, 414. As explained above, this cascode bias 402 may be determined empirically, based on device geometry, testing, or other parameters.

A switching regulator associated with the power supply (VDD) may be adjusted (716), if necessary. For example, the switching regulator controller 304 may be used to cause the switching regulator 104 to set the power supply to 2.5 Volts. As described above, such operation(s) are acceptable because, for example, the cascode transistors 408, 410 are thick-oxide devices that are appropriately biased to work with the thin oxide amplifying transistors 412, 414.

A number of cascode transistors in the amplifier may be programmed to achieve the required current, if necessary (718). That is, it may occur that operating the dual mode transmitter 112 in the high-power, high-linearity mode requires all of the available current (e.g., all of the branches 504 being activated), in which case it may not be necessary to program a number of cascode transistors 408, 410 in the branches 504 to be active (other than to designate that they all should be active).

Once the dual mode transmitter 112 is configured in the above described manner(s) for one of the two example modes of operation, the various settings (e.g., different options for the various settings, such as cascode bias values, switching regulator settings, or numbers of branches 504 to be deactivated) may be stored in memory (720). For example, the settings may be stored in the memory 120, including the firmware 122, for later use during start-up or operation of the device 100.

FIG. 8 is a block diagram of an example of the dual mode transmitter 112. More specifically, the example of FIG. 8 illustrates a transmitter for use with the 802.11x transmission standards, and includes circuitry that may be included in the dual mode transmitter 112 of FIG. 1. For example, a base band modulator 802, digital-to-analog (DAC) converter(s) 804, 806, and filter(s) 808, 810, as well as portions of the Gm (transconductance) stage(s) 812, 814 may represent a portion of the transmission signal processor 114 of FIG. 1.

In FIG. 8, then, the baseband modulator 802 may be used to modulate an input signal. Any appropriate modulation technique may be used, as would be apparent. In FIG. 8, the baseband modulator 802 may use phase-shift keying as a modulation scheme, e.g., quadrature phase shift keying, resulting in, as is known, an in-phase (I) path and a quadrature-phase (Q) path to the signal to be transmitted. Subsequent conversion to analog signals and any necessary filtering of the I, Q paths may be performed by DACs 804, 806 and filters 808, 810, respectively. The Gm stages 812, 814 may be used to convert voltage signals output by the filters 808, 810 into current signals, e.g., for ease in routing.

In FIG. 9, as referenced above, the dual mode transmitter 112 is used in the context of an 802.11x system, which, as is known, may include a high frequency A band channel (5 GHz) and a low frequency G band channel (2.4 GHz). The (current) signals may be routed to the appropriate/desired band using known techniques.

The 802.11x system may include up conversion mixers 906 and 908 configured to upconvert to a corresponding frequency band (e.g., either 2.4 GHz or 5 GHz), PGAs 910 and 912, PADs 914 and 916, inductors 918, 920, optional external amplifiers 922 and 924, and antennae 926 and 928. Relations to earlier-described elements should be apparent. For example, the PGAs 910, 912 may represent examples of the PGA 308, while the PADs 914, 916 may represent examples of the PAD 310, and PAs 922, 924 may represent examples of the external amplifier 118.

Thus, as shown, the power controller 101 may be included in, or may be in communication with, the PADs 914, 916, and so may be used to configure the described operating characteristics of their respective cascode transistors, as explained. Although not specifically illustrated in FIG. 9, it will be appreciated that such operation of the power controller 101 may include configuration of the power supply 102 (e.g., using the switching regulator controller 304 and switching regulator 104).

In general operation, if the 802.11x system of FIG. 9 is to be used as an 802.11g transmitter, then signals to be transmitted may be routed through the upper path in FIG. 9 to the antenna 926. Similarly, if the 802.11x system 900 of FIG. 9 is to be used as an 802.11a transmitter, then the signals may be routed through the lower path in FIG. 9 to the antenna 928. In either case, and as referenced above, the PGAs 910, 912 may be used to drive the PADs 914, 916 (e.g., based on commands from the baseband modulator 802). Appropriate circuitry may be used to convert the differential signal(s) from the PADs 914, 916 into single-ended signals for output to transformers 918, 920. Further general operation of FIG. 9 may either be understood from the above description, or is generally known and not provided here.

Nonetheless, it may be appreciated that the example of FIG. 9 provides at least one example of the need for, and use of, the dual mode transmitter 112 of FIG. 1, in the context of an 802.11x system. For example, the transformers 918, 920 may represent an example of the impedance load referenced above with regard to FIG. 4, which may pass DC voltage to the cascode transistors of the PADs 914, 916 and contribute to the need for thick oxide transistors as the cascode transistors.

While certain features of the described implementations have been illustrated as described herein, many modifications, substitutions, changes and equivalents will now occur to those skilled in the art. For example, although the above description is provided in the context of designing the chip 106 for use in one of the high-power, high-linearity mode or the low-power, low-linearity mode, it should be understood that in some implementations both of these modes may be available to a user, and may be switched between during normal operation of the device 100. It is, therefore, to be understood that the appended claims are intended to cover all such modifications and changes as fall within the true spirit of the embodiments.

What is claimed is:

1. A circuit comprising:
an amplifier configured to provide amplification of a signal for transmission in either a first transmission mode or a second transmission mode, using power supplied from a power supply, the amplifier including at least one cascode transistor in series with at least one amplifying transistor; and
a power controller configured to define an operating characteristic of the at least one cascode transistor, and thereby designate an amount of power from the power supply that is used by the amplifier during the amplification, based on whether the amplifier is to be operated in the first transmission mode or the second transmission mode.

2. The circuit of claim 1 wherein the power controller is configured to cause a change in a voltage from the power supply, based on whether the amplifier is to be operated in the first transmission mode or the second transmission mode.

3. The circuit of claim 2 wherein the change in the voltage from the power supply includes setting a switching regulator to adjust the voltage from the power supply.

4. The circuit of claim 1 wherein the operating characteristic includes a cascode bias level of the at least one cascode transistor.

5. The circuit of claim 4 wherein, in one of the first transmission mode and the second transmission mode, the cascode bias level is set so as to define a drain voltage of the amplifying transistor as being substantially equivalent to a normal operating voltage of the amplifying transistor.

6. The circuit of claim 4 wherein, in one of the first transmission mode and the second transmission mode, the cascode bias level is substantially equivalent to a voltage of the power supply.

7. The circuit of claim 1 wherein the power controller is configured to access a memory to determine the operating characteristic.

8. The circuit of claim 1 wherein the power controller comprises a current controller that is configured to cause a change in a current from the power supply, based on whether the amplifier is to be operated in the first transmission mode or the second transmission mode.

9. The circuit of claim 8 wherein the at least one cascode transistor in series with the at least one amplifying transistor includes a number of decomposed branches, and wherein the operating characteristic of the at least one cascode transistor includes a selective activation or deactivation thereof as part of the change in the current from the power supply.

10. The circuit of claim 9 wherein the selective activation or deactivation thereof of the at least one cascode transistor to provide the change in the current from the power supply includes activating and/or deactivating at least one switch connected to the at least one cascode transistor.

11. The circuit of claim 9 wherein the current controller is configured to access a memory to obtain a number of decomposed branches to be selectively activated or deactivated, based on whether the amplifier is to be operated in the first transmission mode or the second transmission mode.

12. The circuit of claim 1 wherein the at least one cascode transistor includes a thick oxide transistor.

13. A method comprising:
providing an amplifier within a multi-mode transmitter, the amplifier powered by a power supply and including at least one cascode transistor in series with at least one amplifying transistor;
providing a first power control option defining an amount of power used by the amplifier in an operational mode of the transmitter and associated with a first operating characteristic of the at least one cascode transistor; and
providing a second power control option defining an amount of power used by the amplifier in the operational mode of the transmitter and associated with a second operating characteristic of the at least one cascode transistor.

14. The method of claim 13 further comprising providing a memory configured to store information associated with the first and second operating characteristics of the at least one cascode transistor.

15. The method of claim 13 wherein the first power control option includes adjusting a voltage used by the amplifier from the power supply, and wherein the first operating characteristic includes a cascode bias level of the at least one cascode transistor that is set in conjunction with use of a switching regulator to adjust the voltage.

16. The method of claim 13 wherein the second power control option includes adjusting a current drawn from the power supply by the amplifier, and wherein the second operating characteristic includes an activation or deactivation of the at least one cascode transistor from among a plurality of decomposed parallel branches of cascode transistors.

17. A method comprising:
making a determination to operate a transmitter in a first operational mode or a second operational mode, the first operational mode requiring less power for operation of an amplifier of the transmitter than the second operational mode;
setting a bias level of a plurality of cascode transistors of the amplifier, based on the determination;
setting a voltage level of a power supply of the amplifier, based on the determination; and
designating a number of the plurality of cascode transistors to be active within the amplifier, based on the determination.

18. The method of claim 17 wherein one or more of setting the bias level, setting the voltage level, and/or designating the number of the plurality of cascode transistors to be active with the amplifier comprises:
accessing a memory in which one or more of bias levels, voltage levels, and/or numbers of the plurality of cascode transistors are stored 19. The method of claim 17 wherein the designating comprises:
enabling or disabling selected ones of a plurality of decomposed parallel branches of the plurality of cascode transistors, based on the determination.

20. The method of claim 19 wherein the enabling or disabling selected ones of the plurality of cascode transistors further comprises:
controlling a switch connected to a selected one of the plurality of cascode transistors.

* * * * *